(12) United States Patent
Huang

(10) Patent No.: US 9,306,557 B2
(45) Date of Patent: Apr. 5, 2016

(54) CIRCUIT ARRANGEMENT OF GATE SIDE FAN OUT AREA

(71) Applicant: Shenzhen China Star Optoelectronics Technology Co., Ltd., Shenzhen, Guangdong (CN)

(72) Inventor: Xiaoyu Huang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 152 days.

(21) Appl. No.: 14/371,733

(22) PCT Filed: May 28, 2014

(86) PCT No.: PCT/CN2014/078673
§ 371 (c)(1),
(2) Date: Jul. 10, 2014

(87) PCT Pub. No.: WO2015/172406
PCT Pub. Date: Nov. 19, 2015

(65) Prior Publication Data
US 2015/0326220 A1  Nov. 12, 2015

(51) Int. Cl.
*G11C 19/28* (2006.01)
*H03K 17/687* (2006.01)
*G09G 5/00* (2006.01)

(52) U.S. Cl.
CPC ............. *H03K 17/687* (2013.01); *G09G 5/006* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| | | | | |
|---|---|---|---|---|
| 6,420,981 B1* | 7/2002 | Yu | ........................ | G11C 27/02 326/113 |
| 7,148,737 B2* | 12/2006 | Seshita | ................ | H03K 17/693 327/407 |
| 7,757,106 B2* | 7/2010 | Liu | ........................ | G06F 1/3203 327/142 |
| 2004/0041826 A1* | 3/2004 | Nakagawa | ........... | G09G 3/3607 345/694 |
| 2005/0151065 A1* | 7/2005 | Min | ...................... | G09G 3/3406 250/214 R |
| 2005/0162363 A1* | 7/2005 | Kim | ..................... | G09G 3/3614 345/92 |
| 2005/0201508 A1* | 9/2005 | Shin | ..................... | G09G 3/3677 377/10 |
| 2005/0286004 A1* | 12/2005 | Lee | ..................... | G02F 1/13452 349/148 |

* cited by examiner

*Primary Examiner* — Tuan T Lam
(74) *Attorney, Agent, or Firm* — Andrew C. Cheng

(57) ABSTRACT

The present invention is related to a circuit arrangement of a gate side fan out area. The circuit arrangement comprises: a first circuit module (T1), which the gate is coupled to a first input end (A), the drain and the source are respectively coupled to a second input end (B) and a $N_{th}$ gate scan line (N); a first end (1) of the first circuit module is coupled to the first input end, a second end (2) is coupled to the second input end, and a third end (3) is coupled to the $N+1_{th}$ gate scan line (N+1); a first end (1) and a second end (2) of the second circuit module are coupled to the second input end (B), and a third end (3) is coupled to the $N_{th}$ gate scan line (N); a first end (1) and a second end (2) of the third circuit module are coupled to the second input end (B), and a third end (3) is coupled to the $N+1_{th}$ gate scan line (N+1); a periodic square wave is inputted to the first input end (A), and a gate scanning signal is inputted to the second input end (B). The present invention is capable of enormously reducing the cost of a G-COF.

15 Claims, 3 Drawing Sheets

CIRCUIT ARRANGEMENT OF GATE SIDE FAN OUT AREA

BACKGROUND OF THE INVENTION

1. Field of the Invention

The present invention relates to the field of liquid crystal display, and more particularly to a circuit arrangement of a gate side fan out area.

2. The Related Arts

TFT-LCD (Thin Film Transistor Liquid Crystal Display) is one of the most major types of the present flat panel display productions and has already become an important display platform in the modern IT and video productions. In a TFT-LCD, the thin-film transistor, TFT or other active elements are employed to control every pixel unit's switching on/off and to control the light transmission rate of the liquid crystal material according to video signals for displaying images. The liquid crystal display is equipped with a display panel comprising a pixel array and a driving circuit employed for driving the liquid display panel. Multiple parallel data lines and multiple parallel scan lines are formed on the display panel. The data lines and the scan lines crisscross one another. Pixel units and TFT switches of controlling the pixel units are positioned at the crisscrosses. The driving circuit comprises a source driver and a gate driver. The source drive provides signals related with showing images to the data lines. The gate driver provides signals of switching on/off the thin film transistors to the scan lines.

As shown in FIG. 1, which is a TFT-LCD driving structure diagram according to prior art. The primary driving principle of a present TFT-LCD comprises: a system mainboard connects the lines of R/G/B compression signals, control signals and power to a connector of PCB 1. The PCB 1 connects the display area 4 via a S-COF (Source-Chip on Film) 2 and a G-COF (Gate-Chip on Film) 3. Accordingly, LCD obtains required power and signals. For realizing a narrow frame design and meeting the development of electronic products to be thinner, smaller, with better functions and faster. The package skill for the driving chips is accordingly developed toward the same way of being thinner and smaller. Both the gate chip and the source chip utilizes COF (Chip on Film) package. As shown in FIG. 1, a fan out area 5 is the part which the signal the lines of the display area 4 and the driving chip are connected. The fan out area 5 at a side of the G-COF 3 is so called a gate side fan out area.

Under the present structure, in a case of a liquid crystal display with resolution m×n, 3m source data lines and n gate scan lines are required. The necessary amounts of the data drivers and scan drivers are respectively 3m/a and n/b if the channel number of the data drivers and scan drivers are respectively a and b. The prices of the data drivers are higher than those of the scan drivers. The number of data drivers is larger and results in higher manufacture cost. A general solution is to arrange the R pixel electrode, the G pixel electrode and the B pixel electrode along the direction of the scan lines. For a liquid crystal display with the same m×n resolution, only m data lines and 3n scan lines are required. Accordingly, the necessary amounts of the data drivers and scan drivers are respectively m/a and 3n/b. The necessary number of the data drivers is reduced to ⅓. One way or another, the manufacture cost can be reduced. Nevertheless, the number of the scan drivers is tripled which cannot be beneficial for the manufacture cost.

Be that as it may, the resolution of the liquid crystal display is proportional with the number of the gate scan lines. As peaking demand regarding the resolution of the liquid crystal display, the real application requirement only can be satisfied by increasing the number of the G-COF or the number of the single G-COF output channel. Then, the manufacture cost is meant to be raised and the bonding yield is meant to be dropped.

SUMMARY OF THE INVENTION

Accordingly, the present invention provides a design solution for a circuit arrangement of a gate side fan out area which is capable of reducing the cost of a G-COF.

For achieving the aforesaid objective, the present invention provides a circuit arrangement of a gate side fan out area, comprising: a first circuit module, a second circuit module, a third circuit module and a first transistor;

a gate of the first transistor is coupled to a first input end, a drain and a source of the first transistor are respectively coupled to a second input end and a $N_{th}$ gate scan line, and N is a nature number;

a first end of the first circuit module is coupled to the first input end, a second end of the first circuit module is coupled to the second input end, and a third end of the first circuit module is coupled to the $N+1_{th}$ gate scan line;

a first end and a second end of the second circuit module are coupled to the second input end, and a third end of the second circuit module is coupled to the $N_{th}$ gate scan line;

a first end and a second end of the third circuit module are coupled to the second input end, and a third end of the third circuit module is coupled to the $N+1_{th}$ gate scan line;

a periodic square wave is inputted to the first input end, and a gate scanning signal is inputted to the second input end, and a period of the periodic square wave is twice a scanning period of the gate scanning signal;

the first circuit module is in off state between the second end and the third end when an input voltage to the first end of the first circuit module is equal to a first amplitude voltage of the periodic square wave; the first circuit module is in on state between the second end and the third end when an input voltage to the second end of the first circuit module is equal to a second amplitude voltage of the periodic square wave;

the second circuit module is in off state between the second end and the third end when an input voltage to the first end of the second circuit module is equal to a first amplitude voltage of the periodic square wave; the second circuit module is in on state between the second end and the third end when an input voltage to the second end of the second circuit module is equal to a second amplitude voltage of the periodic square wave;

the third circuit module is in off state between the second end and the third end when an input voltage to the first end of the third circuit module is equal to a first amplitude voltage of the periodic square wave; the third circuit module is in on state between the second end and the third end when an input voltage to the first end of the third circuit module is equal to a second amplitude voltage of the periodic square wave.

The first transistor (T1) is a NMOS transistor.

The circuit arrangements of the first circuit module, the second circuit module and the third circuit module are the same.

The first circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the first circuit module.

The second circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the second circuit module.

The third circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the third circuit module.

The first amplitude voltage is preferably to be 3.3V.
The second amplitude voltage is preferably to be −7V.

The first amplitude voltage and the second amplitude voltage are employed for controlling on and off states of the first circuit module, the second circuit module and the third circuit module. Therefore, the specific setting value is not limited to 3.3V/−7V. Other proper values are also can be considered. Preferably, these can be selected from the design specification of the gate side circuit voltage.

The gate scanning signal is from a G-COF.
The gate scanning signal is from a gate driving circuit.

The present invention also provides a circuit arrangement of a gate side fan out area, comprising: a first circuit module, a second circuit module, a third circuit module and a first transistor;

a gate of the first transistor is coupled to a first input end, a drain and a source of the first transistor are respectively coupled to a second input end and a $N_{th}$ gate scan line, and N is a nature number;

a first end of the first circuit module is coupled to the first input end, a second end of the first circuit module is coupled to the second input end, and a third end of the first circuit module is coupled to the $N+1_{th}$ gate scan line;

a first end and a second end of the second circuit module are coupled to the second input end, and a third end of the second circuit module is coupled to the $N_{th}$ gate scan line;

a first end and a second end of the third circuit module are coupled to the second input end, and a third end of the third circuit module is coupled to the $N+1_{th}$ gate scan line;

a periodic square wave is inputted to the first input end, and a gate scanning signal is inputted to the second input end, and a period of the periodic square wave is twice a scanning period of the gate scanning signal;

the first circuit module is in off state between the second end and the third end when an input voltage to the first end of the first circuit module is equal to a first amplitude voltage of the periodic square wave; the first circuit module is in on state between the second end and the third end when an input voltage to the second end of the first circuit module is equal to a second amplitude voltage of the periodic square wave;

the second circuit module is in off state between the second end and the third end when an input voltage to the first end of the second circuit module is equal to a first amplitude voltage of the periodic square wave; the second circuit module is in on state between the second end and the third end when an input voltage to the second end of the second circuit module is equal to a second amplitude voltage of the periodic square wave;

the third circuit module is in off state between the second end and the third end when an input voltage to the first end of the third circuit module is equal to a first amplitude voltage of the periodic square wave; the third circuit module is in on state between the second end and the third end when an input voltage to the first end of the third circuit module is equal to a second amplitude voltage of the periodic square wave;

wherein the first transistor is a NMOS transistor;
wherein circuit arrangements of the first circuit module, the second circuit module and the third circuit module are the same;

wherein the first circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the first circuit module;

wherein the second circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the second circuit module;

wherein the third circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the third circuit module.

The first amplitude voltage can be 3.3V.
The second amplitude voltage can be −7V.
The gate scanning signal is from a G-COF.
The gate scanning signal is from a gate driving circuit.

In conclusion, the circuit arrangement of the gate side fan out area according to the present invention is capable of enormously reducing the cost of a G-COF. Without any additional equipment cost, the product quality is promoted and the competitiveness of the product can be raised accordingly.

BRIEF DESCRIPTION OF THE DRAWINGS

The technical solution, as well as beneficial advantages, of the present invention will be apparent from the following detailed description of an embodiment of the present invention, with reference to the attached drawings. In the attached drawings.

DETAILED DESCRIPTION OF PREFERRED EMBODIMENTS

Figure 1:
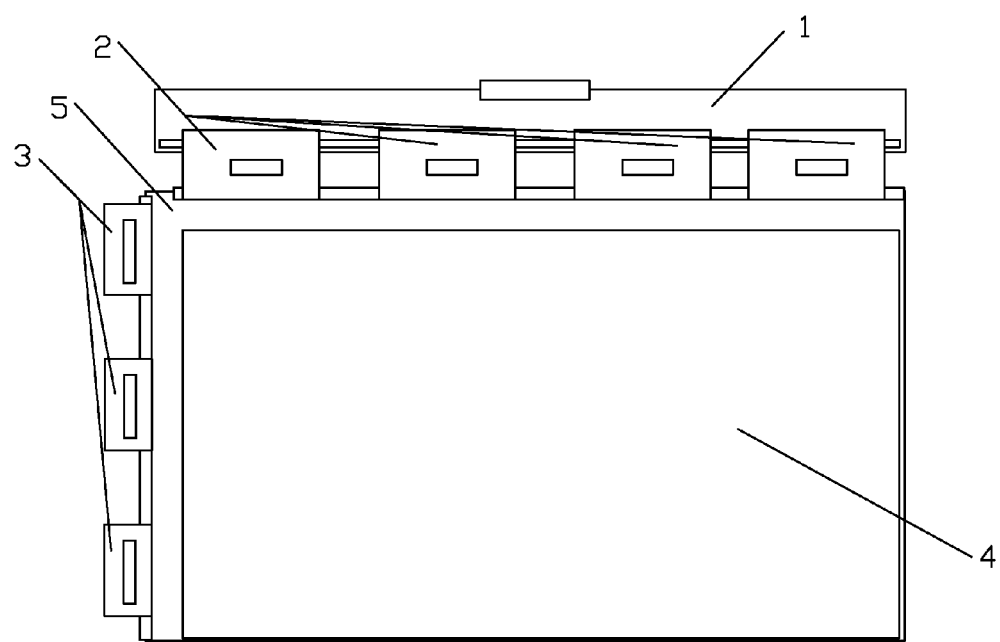
FIG. 1 is a TFT-LCD driving structure diagram according to prior art.
Figure 2:
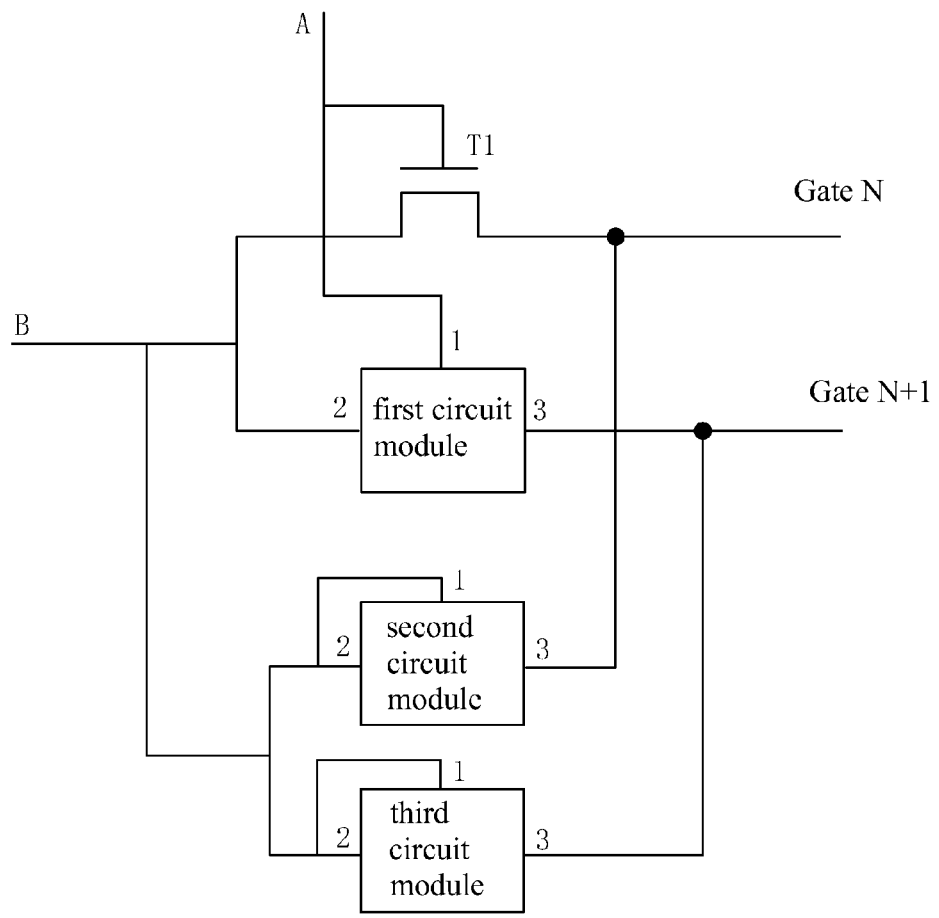
FIG. 2 is a circuit diagram of a circuit arrangement of a gate side fan out area according to one preferable embodiment of the present invention.

Referring to FIG. 2, which shows a circuit diagram of a circuit arrangement of a gate side fan out area according to one preferable embodiment of the present invention. The circuit arrangement of the gate side fan out area according to the preferable embodiment mainly comprises: a first circuit module, a second circuit module, a third circuit module and a first transistor T1; in this preferable embodiment, a NMOS transistor can be employed as the first transistor T1. It is understandable to any persons who are skilled in the art, other types of transistors also can be selected for replacing the NMOS transistor in the present invention;

a gate of the first transistor T1 is coupled to a first input end A, a drain and a source of the first transistor are respectively coupled to a second input end B and a $N_{th}$ gate scan line, and N is a nature number;

a first end 1 of the first circuit module is coupled to the first input end A, a second end 2 of the first circuit module is coupled to the second input end B, and a third end 3 of the first circuit module is coupled to the $N+1_{th}$ gate scan line;

a first end 1 and a second end 2 of the second circuit module are coupled to the second input end B, and a third end 3 of the second circuit module is coupled to the $N_{th}$ gate scan line;

a first end 1 and a second end 2 of the third circuit module are coupled to the second input end B, and a third end 3 of the third circuit module is coupled to the $N+1_{th}$ gate scan line;

a periodic square wave is inputted to the first input end A, and a gate scanning signal is inputted to the second input end B, and a period of the periodic square wave is twice a scanning period of the gate scanning signal;

the first circuit module is in off state between the second end 2 and the third end 3 when an input voltage to the first end 1 of the first circuit module is equal to a first amplitude voltage of the periodic square wave; the first circuit module is in on state between the second end 2 and the third end 3 when an input voltage to the second end 2 of the first circuit module is equal to a second amplitude voltage of the periodic square wave;

the second circuit module is in off state between the second end 2 and the third end 3 when an input voltage to the first end 1 of the second circuit module is equal to a first amplitude voltage of the periodic square wave; the second circuit module is in on state between the second end 2 and the third end 3 when an input voltage to the second end 2 of the second circuit module is equal to a second amplitude voltage of the periodic square wave;

the third circuit module is in off state between the second end 2 and the third end 3 when an input voltage to the first end 1 of the third circuit module is equal to a first amplitude voltage of the periodic square wave; the third circuit module is in on state between the second end 2 and the third end 3 when an input voltage to the first end 1 of the third circuit module is equal to a second amplitude voltage of the periodic square wave.

Figure 3:
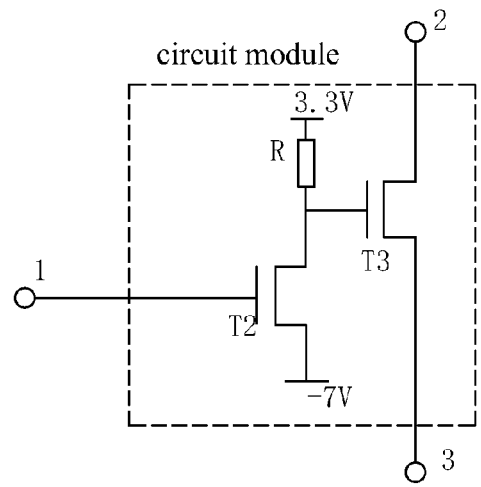
FIG. 3 is a circuit arrangement diagram of an employed circuit module in the preferable embodiment.
Figure 4:
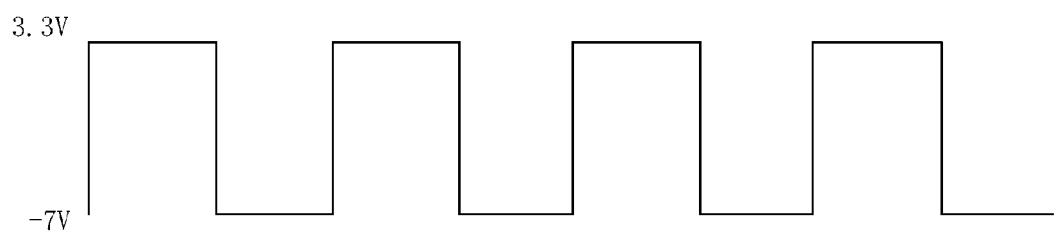
FIG. 4 is an oscillogram of an employed periodic square wave in the preferable embodiment.

Please understand the present invention with the combination of FIG. 3 and FIG. 4. FIG. 3 is a circuit arrangement diagram of an employed circuit module in the preferable embodiment. FIG. 4 is an oscillogram of an employed periodic square wave in the preferable embodiment. A periodic square wave with amplitudes 3.3V/−7V is inputted to the first input end A. A period of the periodic square wave is twice a scanning period of the gate scanning signal. The real outputted signal from a G-COF is inputted to the second input end B. Alternatively, a signal, similar as a signal from a gate driving circuit which is employed for outputting a gate scanning signal, also can be the signal inputted to the second input end B. The first circuit module, the second circuit module and the third circuit module of the present invention are functionally the same. All the modules are in off state between the second end and the third end when an input voltage to the first end is with an amplitude 3.3V; the modules are in on state between the second end and the third end when an input voltage to the first end is with an amplitude −7V. Therefore, for simplifying the circuit, the first circuit module, the second circuit module and the third circuit module utilize the same circuit arrangement in this embodiment. Each of the circuit modules comprises a second NMOS transistor T2 and a third NMOS transistor T3; a gate of the second NMOS transistor T2 is employed as the first end 1 of the circuit module, a source and a drain of the second NMOS transistor T2 are respectively inputted with the first amplitude voltage and the second amplitude voltage; a gate of the third NMOS transistor T3 is inputted with the first amplitude voltage, and a source and a drain of the third NMOS transistor T3 are respectively employed as the second end 2 and the third end 3 of the circuit module. The resistance R is an equivalent resistance as the NMOS is in on state. It is understandable to any persons who are skilled in the art, other circuit module with similar functions also can be applied in the present invention.

During the function time of the system, the second circuit module and the third circuit module are in off state when second input end B outputs a high level voltage, and the first circuit module is in off state when the first input end A outputs a 3.3V voltage, the gate scan line N outputs a high level voltage and the output of the gate scan line N+1 is 0; the first circuit module is in on state when the first input end A outputs a −7V voltage, the output of the gate scan line N is 0V, the output of the gate scan line N+1 is a high level voltage; the second circuit module and the third circuit module are in off state when second input end B outputs a low level voltage, and both the gate scan line N and the gate scan line N+1 output a low level voltage. That is, By utilizing one channel output of the present G-COF, it is capable of corresponding to two scan lines.

In conclusion, for solving the contradiction of the continuing demand of higher resolution and constant requirement of lower production cost from the market. On the design basis of a G-COF, the combination circuit among multiple NMOS is employed in the gate side fan out area to put on an additional architecture realize that function of utilizing one channel output of a G-COF corresponding to two scan lines. It is capable of enormously reducing the cost of a G-COF. Without any additional equipment cost, the product quality is promoted and the competitiveness of the product can be raised accordingly.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A circuit arrangement of a gate side fan out area, comprising: a first circuit module, a second circuit module, a third circuit module and a first transistor;

a gate of the first transistor is coupled to a first input end, a drain and a source of the first transistor are respectively coupled to a second input end and a $N_{th}$ gate scan line, and N is a nature number;

a first end of the first circuit module is coupled to the first input end, a second end of the first circuit module is coupled to the second input end, and a third end of the first circuit module is coupled to the $N+1_{th}$ gate scan line;

a first end and a second end of the second circuit module are coupled to the second input end, and a third end of the second circuit module is coupled to the $N_{th}$ gate scan line;

a first end and a second end of the third circuit module are coupled to the second input end, and a third end of the third circuit module is coupled to the $N+1_{th}$ gate scan line;

a periodic square wave is inputted to the first input end, and a gate scanning signal is inputted to the second input end, and a period of the periodic square wave is twice a scanning period of the gate scanning signal;

the first circuit module is in off state between the second end and the third end when an input voltage to the first end of the first circuit module is equal to a first amplitude voltage of the periodic square wave; the first circuit module is in on state between the second end and the third end when an input voltage to the second end of the first circuit module is equal to a second amplitude voltage of the periodic square wave;

the second circuit module is in off state between the second end and the third end when an input voltage to the first end of the second circuit module is equal to a first amplitude voltage of the periodic square wave; the second circuit module is in on state between the second end and the third end when an input voltage to the second end of the second circuit module is equal to a second amplitude voltage of the periodic square wave;

the third circuit module is in off state between the second end and the third end when an input voltage to the first end of the third circuit module is equal to a first amplitude voltage of the periodic square wave; the third circuit module is in on state between the second end and the third end when an input voltage to the first end of the third circuit module is equal to a second amplitude voltage of the periodic square wave.

2. The circuit arrangement of the gate side fan out area according to claim 1, wherein the first transistor is a NMOS transistor.

3. The circuit arrangement of the gate side fan out area according to claim 1, wherein circuit arrangements of the first circuit module, the second circuit module and the third circuit module are the same.

4. The circuit arrangement of the gate side fan out area according to claim 1, wherein the first circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the first circuit module.

5. The circuit arrangement of the gate side fan out area according to claim 1, wherein the second circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the second circuit module.

6. The circuit arrangement of the gate side fan out area according to claim 1, wherein the third circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the third circuit module.

7. The circuit arrangement of the gate side fan out area according to claim 1, wherein the first amplitude voltage is 3.3V.

8. The circuit arrangement of the gate side fan out area according to claim 1, wherein the second amplitude voltage is −7V.

9. The circuit arrangement of the gate side fan out area according to claim 1, wherein the gate scanning signal is from a G-COF.

10. The circuit arrangement of the gate side fan out area according to claim 1, wherein the gate scanning signal is from a gate driving circuit.

11. A circuit arrangement of a gate side fan out area, comprising: a first circuit module, a second circuit module, a third circuit module and a first transistor;

a gate of the first transistor is coupled to a first input end, a drain and a source of the first transistor are respectively coupled to a second input end and a $N_{th}$ gate scan line, and N is a nature number;

a first end and a second end of the second circuit module are coupled to the second input end, and a third end of the second circuit module is coupled to the $N_{th}$ gate scan line;

a first end and a second end of the third circuit module are coupled to the second input end, and a third end of the third circuit module is coupled to the $N+1_{th}$ gate scan line;

a periodic square wave is inputted to the first input end, and a gate scanning signal is inputted to the second input end, and a period of the periodic square wave is twice a scanning period of the gate scanning signal;

the first circuit module is in off state between the second end and the third end when an input voltage to the first end of the first circuit module is equal to a first amplitude voltage of the periodic square wave; the first circuit module is in on state between the second end and the third end when an input voltage to the second end of the first circuit module is equal to a second amplitude voltage of the periodic square wave;

the second circuit module is in off state between the second end and the third end when an input voltage to the first end of the second circuit module is equal to a first amplitude voltage of the periodic square wave; the second circuit module is in on state between the second end and the third end when an input voltage to the second end of the second circuit module is equal to a second amplitude voltage of the periodic square wave;

the third circuit module is in off state between the second end and the third end when an input voltage to the first end of the third circuit module is equal to a first amplitude voltage of the periodic square wave; the third circuit module is in on state between the second end and the third end when an input voltage to the first end of the third circuit module is equal to a second amplitude voltage of the periodic square wave;

wherein the first transistor is a NMOS transistor;

wherein circuit arrangements of the first circuit module, the second circuit module and the third circuit module are the same;

wherein the first circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the first circuit module;

wherein the second circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the second circuit module;

wherein the third circuit module comprises a second NMOS transistor and a third NMOS transistor; a gate of the second NMOS transistor is employed as the first end of the first circuit module, a source and a drain of the second NMOS transistor are respectively inputted with the first amplitude voltage and the second amplitude voltage; a gate of the third NMOS transistor is inputted with the first amplitude voltage, and a source and a drain of the third NMOS transistor are respectively employed as the second end and the third end of the third circuit module.

12. The circuit arrangement of the gate side fan out area according to claim 11, wherein the first amplitude voltage is 3.3V.

13. The circuit arrangement of the gate side fan out area according to claim 11, wherein the second amplitude voltage is −7V.

14. The circuit arrangement of the gate side fan out area according to claim 11, wherein the gate scanning signal is from a G-COF.

15. The circuit arrangement of the gate side fan out area according to claim 11, wherein the gate scanning signal is from a gate driving circuit.

* * * * *